Jan. 23, 1962 M. W. AARONS ET AL 3,018,423

SEMICONDUCTOR DEVICE

Filed May 16, 1960

WITNESSES

INVENTORS
Melvin W. Aarons
John W. Dzimianski
John M. Bentley
BY
ATTORNEY 3,018,423

SEMICONDUCTOR DEVICE

Melvin W. Aarons, Baltimore, John W. Dzimianski, Catonsville, and John M. Bentley, Glen Burnie, Md., assignors to Westinghouse Electric Corporation, East Pittsburgh, Pa., a corporation of Pennsylvania Filed May 16, 1960, Ser. No. 29,464
16 Claims. (Cl. 317—234)

This invention relates to semiconductor devices, and more particularly to a two-terminal three-zone device having two p-n junctions with highly individual voltage-current characteristics to provide a new and novel device characteristic.

An object of the invention is to provide a two-terminal semiconductor device having negative resistance over a portion of the voltage-current characteristic curve in one quadrant thereof.

Another object is to provide a two-terminal semiconductor device having three zones providing two p-n junctions, the device exhibiting negative resistance over a portion of its voltage-current characteristic curve while one of said junctions is biased in a forward direction, the device exhibiting a voltage-current characteristic controlled by the other junction while the other junction is biased in a forward direction.

These and other objects of the present invention will be more clearly apparent after a study of the following specification, when read in connection with the accompanying drawings, in which.

Figure 1:
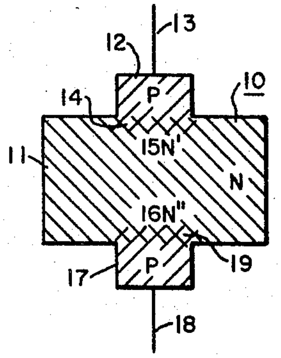
FIG. 1 is a side view in cross section of the device according to the preferred embodiment thereof.

In FIG. 1, there is shown a semiconductor member, generally designated 10, which may be of wafer shape as shown, and which for the purposes of illustration only is chosen as having been formed from a bulk portion 11 composed of material of an n-type of semiconductivity. For reasons which will be made more clearly apparent hereinafter, the doping of the entire region of n-type material is not uniform throughout. One portion or region 16 of n-type semiconductivity, the portion designated N″, is sufficiently heavily doped so that the semiconductor material is almost degenerate, but is not degenerate. The region 15 or portion N′ is more heavily doped so that this region or portion is degenerate. A suitable concentration for the region N″ is approximately $5\times10^{18}$ carriers per cubic centimeter and a suitable doping for the region or portion N′ is approximately from $5\times10^{19}$ to $1\times10^{21}$ impurities or carriers per cubic centimeter. The manner in which these doping concentrations may be obtained will be set forth hereinafter. A zone or region 12 of heavily doped material of p-type semiconductivity has ohmic connection 13 thereto, and forms with the portion 15 or N′ a very thin or narrow junction 14 which may have a width of 80 angstroms. The region 12 of p-type semiconductivity is sufficiently heavily doped to be degenerate, and may have a carrier concentration of the order of $5\times10^{20}$ per cubic centimeter. Accordingly, there is provided at 14 an abrupt, narrow p-n junction between the regions or zones 12 and 15. The junction 14 is characterized by quantum mechanical tunneling of the electrons across the p-n junction when an initial extremely small forward bias is applied, resulting in a large forward current for small values of forward bias. As the forward bias increases, a point is reached at which the current through the junction decreases, providing for negative resistance over this portion of the device's current-voltage (I–V) characteristic curve. A semiconductor device having these characteristics is more fully described in a copending application by Herbert W. Henkels for "Semiconductor Device," Serial No. 853,863, filed November 18, 1959, and assigned to the assignee of the instant invention. In this copending application the theory underlying the tunneling of electrons through the barrier of a thin junction formed between two heavily doped degenerate materials of opposite semiconductivity type to provide a negative resistance voltage-current characteristic in the first quadrant of the device is set forth in greater detail.

Adjacent the portion 16 or N″ is a zone or region 17 of p-type semiconductivity material having ohmic connection 18 thereto and forming with region 16 a p-n junction 19. The zone or region 17 of p-type semiconductivity is sufficiently heavily doped to be degenerate, and may have a carrier concentration of the order of $5\times10^{20}$ per cubic centimeter, whereas as before stated, the zone or region 16 of n-type material is almost but not degenerate in nature. There is provided then at 19 a junction which will be referred to herein as a backward diode junction, and the appropriateness of this term will become more apparent hereinafter. For a further discussion of backward diode junctions, reference may be had to an article by Aarons appearing in the proceedings of the WESCON conference, 1959, vol. 3,, on "Electron Devices."

To produce the three-zone, two-terminal semiconductor device of FIG. 1, the process may be started with a semiconductor wafer uniformly doped to such a concentration of impurities that it consists of almost but not quite degenerate material. Both sides of the wafer can then be diffused with impurities of the same type as the semiconductivity type of the material, making the surfaces and the adjacent portions of the wafer degenerate. Thereafter one surface may then be etched to reach a region or depth where the degeneracy is not present, and thereafter two degenerate emitters can be alloyed into the device. The unetched surface produces the junction 14 which will, for convenience, be referred to herein as the tunnel diode junction while the etched surface produces the backward diode junction.

Figure 5:
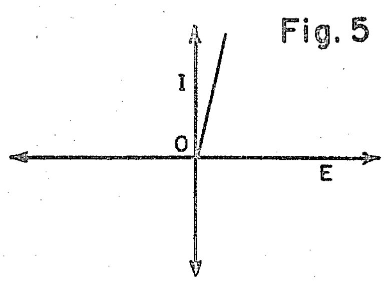
Figure 7:
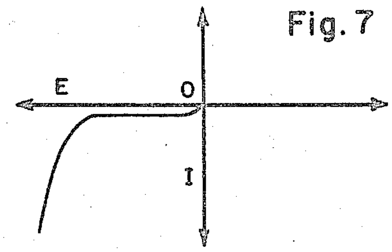

The voltage-current characteristic of the backward diode junction 19 when considered by itself is shown in FIGS. 5 and 7. Both FIGS. 5 and 7 are reversed 180° and are shown in quadrants diametrically opposite to the quadrants in which they occur. This is done to facilitate an understanding of the invention for, as will be noted in connection with FIG. 1, when the tunnel diode junction 14 is biased in a forward direction, the backward diode junction 19 will be biased in a reverse direction, and while the tunnel diode junction 14 is biased in a reverse direction, the backward diode junction 19 will be biased in a forward direction. As will become more clearly apparent hereinafter, the overall voltage-current characteristic of the device is controlled by the tunnel diode junction 14 while the tunnel diode junction is biased in a forward direction, and the overall characteristic of the device is controlled by the backward diode junction 19 while the backward diode junction is biased in a forward direction.

Figure 4:
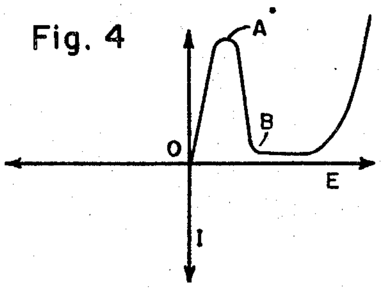
FIGS. 4, 5, 6 and 7 are graphs showing the characteristics of the junctions of the device of FIG. 1 under certain bias conditions.
Figure 6:
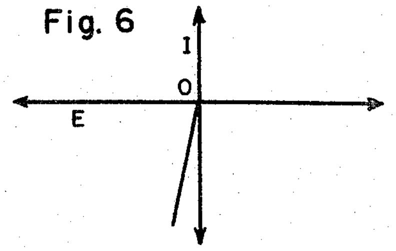

FIGS. 4 and 6 are the voltage-current characteristic curves of the tunnel or negative resistance diode junction 14 while this diode junction is biased in a forward direction and biased in a reverse direction, respectively. It will be noted that as the forward bias on the junction 14 increases to a small value the current through the junction rapidly increases until a point A is reached, at which time the current rapidly decreases in value as the voltage is further increased until the point B is reached, the junction or device being characterized by negative resistance over the portion of its characteristic curve substantially from A to B. A further increase in voltage results in a gradual rise in current as shown. While biased in a reverse direction, the tunnel diode junction 14 has the characteristics shown in FIG. 6, in which the reverse current is shown to rapidly increase in a substantially linear fashion with increase in voltage.

Figure 2:
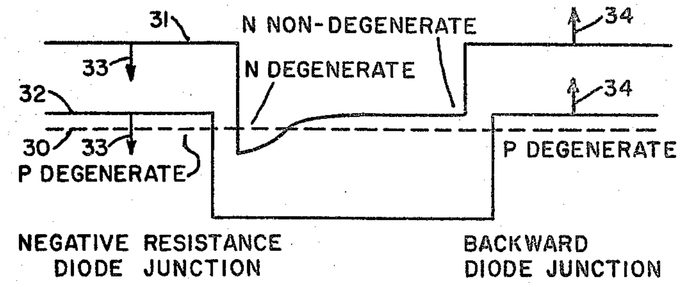
FIG. 2 is a graph showing the energy bands in the device of FIG. 1 while no bias is applied thereto.

With respect to the backward diode junction 19, and referring particularly to FIG. 2, the backward diode has the following band structure at thermal equilibrium and with no bias applied in either direction; the Fermi level is right up against the edge of the valence band on the "p" side of the junction, and right against the edge of the conduction band on the "n" side of the junction.

If now a forward bias is applied, the bands are shifted relative to each other farther apart; the only mechanism of conduction is by normal injection of carriers, so that the junction behaves as a normal looking p-n junction while biased in a forward direction. A large current will not develop until sufficient bias or voltage has been applied to enable appreciable injection of carriers.

If now a reverse potential is applied to the backward junction, as soon as the reverse potential is applied the edge of the valence band is lifted up relative to the conduction band and electrons in the valence band can see available states in the conduction band on the other side of the junction. The field builds up to a high value at extremely low potentials; Zener breakdown occurs and electrons in the valence band tunnel over to allowable states in the conduction band.

In order for the strong or intense field to exist, the junction barrier must be very narrow, on the order of 150 to 200 angstroms. Then, for small applied reverse potentials, a large field is produced, Zener conditions are fulfilled, and large currents flow for small potentials.

The forward and reverse characteristics of the backward diode junction 19 are shown in the current-voltage (I-V) characteristic curves of FIGS. 7 and 5, respectively. The curve of FIG. 7 may be referred to hereinafter as the normal p-n junction characteristic, with forward bias.

Figure 3:
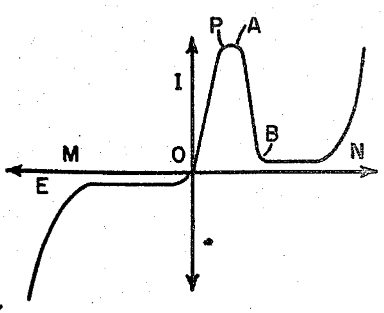
FIG. 3 is a graph showing the overall characteristic curve of the device of FIG. 1.

Particular reference should be made now to FIG. 3 which shows the overall voltage-current characteristic of the device of FIG. 1, it being recalled that while the tunnel or negative resistance diode junction 14 is biased in a forward direction the backward diode junction 19 is biased in a reverse direction, and while the diode junction 14 is biased in a reverse direction, the backward diode junction 19 is biased in a forward direction. Assume for purposes of description that the junction 14 has a small forward bias applied thereto. The negative resistance junction 14 will have the characteristic shown in FIG. 4 while the backward junction 19 will just draw current limited by, or which cannot exceed, the current of the negative resistance diode junction 14 even though the backward diode junction 19 is in a high current breakdown region, as shown in FIG. 5. However, as the potential across the junction 14 increases, and at a potential of about 50 millivolts in germanium, the diode junction 14 starts to shut off, that is, it moves into the curve portion from A to B and its high direct current impedance prohibits continued current resulting from tunneling of electrons from the narrow reversed-bias backward diode junction 19. Therefore, the overall characteristic of device 10 is substantially entirely governed by the negative resistance diode junction 14 while this junction is biased in a forward direction.

Assume now by way of description that the direct current potential across leads 13 and 18 is reversed in polarity. The junction 14 now has a characteristic shown by FIG. 6, while the backward diode junction 19, as seen in FIG. 7, even though biased in a forward direction, does not conduct a large current until sufficient forward bias has been applied to enable appreciable injection of minority carriers to occur, as previously mentioned. This is due to the fact that the bulk side 16 or N'' of the backward diode junction is nondegenerate. The high impedance of the backward diode junction 19 for small forward biases blocks the passage of a greater current which would otherwise result from the reverse-biased tunnel diode junction 14. The resulting composite curve is therefore that shown in FIG. 3.

The aforedescribed semiconductor device has the very useful property of discriminating between positive and negative pulses at very low voltage levels in the order of millivolts. For example, where germanium is the semiconductor material employed, the voltage at points M and N in FIG. 3 would represent about 300 millivolts, while point P would represent about 50 millivolts. Conduction in the forward direction would start at zero volts.

The device described hereinbefore will function at very low voltage levels and is especially suitable for use in computers that will have a power level on the order of 1/1000 of that found in a transistorized computer. The device described also represents a means for the reduction of power level in molecular engineered systems.

Particular reference should be made again to FIG. 2, which shows the energy bands of carriers in the two junctions. The line 30 represents the Fermi level, and the curves 31 and 32 define the energy bands while there is no bias applied to the device. In FIG. 2, where no bias is applied, the electrons in the various bands are substantially equal and a condition of equilibrium exists with no current flow. When a forward bias is applied to the negative resistance diode junction 14, both the lines 31 and 32 are moved downward as indicated by the arrows 33. It will be seen that the shift of the lines 31 and 32 downward indicates the movement of carriers into energy bands which permit the conduction of current. At the same time that a forward bias is applied to the negative resistance diode junction 14, a reverse bias is applied to the backward diode junction 19 effectively moving that portion of lines 31 and 32 upward as indicated by arrows 34. If the bias across the entire device as represented by the potential across the aforementioned ohmic contacts 13 and 18 is reversed in polarity, the opposite effect is produced from that shown in the graph of FIG. 2.

There has been provided, then, a semiconductor device well suited to accomplish the aforedescribed objects of the invention.

Whereas the invention has been shown and described with reference to a device of the PNP variety, it will be readily understood that an NPN combination of semiconductor regions could be employed, if desired.

The term "degenerate" as employed herein indicates a sufficiently high concentration of carriers so that the material acts essentially like a conductor rather than a semiconductor.

The device may employ as a basic semiconductor material any semiconductor material which can have the semiconductivity controlled to give the desired junction characteristics, including germanium or silicon, and any of the III–V compound semiconductors such as gallium arsenide, gallium phosphide, indium antimonide, as desired.

Whereas the invention has been shown and described with respect to an embodiment thereof which gives satisfactory results, it should be understood that changes may be made and equivalents substituted without departing from the spirit and scope of the invention.

We claim as our invention:

1. A two-terminal three-zone semiconductor device which displays a negative resistance due to quantum mechanical tunneling over a portion of the I-V characteristic curve while the device has a potential of predetermined polarity applied thereto and which displays a different I-V characteristic curve of predetermined characteristics while the potential across the terminals is reversed in polarity, comprising a first region of a semiconductor material of a first type of semiconductivity, the material of said first region being doped to a high concentration of carriers whereby the material is degenerate, a second region of a material of a second type of semiconductivity having one surface thereof disposed upon and contiguous with one surface of said first-named region and forming therewith a first narrow p-n junction characterized by quantum mechanical tunneling of electrons while a small potential difference exists thereacross, the second region having a gradient in the carrier concentration therein between two portions thereof, the portion of the second region adjacent the first-named region being doped to a high degree of carrier concentration whereby the material of the last-named portion is degenerate, a third region of a semiconductor material of the first type of semiconductivity disposed upon and contiguous with the surface of the other portion of said second region and forming therewith a second p-n junction, the portion of the second region adjacent the third region being doped to a carrier concentration whereby the last-named portion of the second region is almost degenerate, said third region being doped to a carrier concentration whereby the material of the third region is degenerate, and ohmic contacts disposed upon and contiguous with one surface of said first region and one surface of said third region.

2. A two-terminal three-zone semiconductor device which displays a negative resistance due to quantum mechanical tunneling over a portion of the I-V characteristic curve while the device has a potential of one polarity applied to the terminals and which displays a different I-V characteristic curve similar to that of a forward-biased backward diode while a potential of the opposite polarity is applied to said terminals, comprising a first region of a semiconductor material of a first type of semiconductivity, an ohmic contact disposed upon and contiguous with one surface of said first region, the semiconductor material of the first region being doped to a high carrier concentration of the order of $5\times10^{20}$ per cubic centimeter whereby the semiconductor material of the first region is degenerate, a second region of a semiconductor material of a second type of semiconductivity having one surface thereof adjacent and contiguous with the other surface of said first region and forming therewith a first narrow p-n junction, the second region having a non-uniform carrier concentration, the portion of said second region adjacent the first region being doped to a high carrier concentration of the order of $5\times10^{19}$ carriers per cubic centimeter and being degenerate, a third region of semiconductor material of said first type of semiconductivity disposed upon and contiguous with the other surface of said second region and forming therewith a second p-n junction, the portion of the second region of semiconductor material adjacent the third region being doped to a concentration less than that necessary to render the portion degenerate and having a carrier concentration of the order of $5\times10^{18}$ carriers per cubic centimeter, the third region of semiconductor material of the first type of semiconductivity being doped to a high carrier concentration of the order of $5\times10^{20}$ per cubic centimeter whereby the third region is degenerate, and an ohmic contact disposed upon and contiguous with the other surface of said third region.

3. A two-terminal three-zone semiconductor device having first and second p-n junctions, said first p-n junction controlling the conductivity of the device while a potential of a first predetermined polarity is applied between the two terminals, said second p-n junction controlling the conductivity of the device while a potential of opposite polarity is applied between said two terminals, comprising a first region of a semiconductor material of a first type of semiconductivity, the semiconductor material of said first region being doped to a high carrier concentration whereby the semiconductor material of the first region is degenerate, a second region of a semiconductor material of a second type of semiconductivity having one surface thereof disposed upon and contiguous with one surface of the first region to form the first p-n junction, a third region of a semiconductor material of said first type of semiconductivity disposed upon and contiguous with the other surface of said second region to form the second p-n junction, the portion of the second region adjacent the first region being doped to a high degree of concentration whereby the portion of the second region adjacent the first region is degenerate, the portion of the second region adjacent the third region being doped to a lesser carrier concentration whereby the portion of the second region adjacent the third region is almost degenerate, the material of the third region being doped to a high degree of carrier concentration whereby the material of the third region is degenerate, and ohmic contacts disposed upon and contiguous with one surface of the first region and one surface of the third region to form the two terminals.

4. A semiconductor device according to claim 3 wherein the first p-n junction is additionally characterized as displaying negative resistance over a portion of the I-V characteristic curve in a predetermined quadrant due to quantum mechanical tunneling while a potential of said first predetermined polarity is applied to the semiconductor device.

5. A semiconductor device according to claim 3 additionally characterized in that the second p-n junction displays a voltage-current characteristic similar to the characteristic of a normal forward-biased p-n junction while a potential of said opposite polarity is applied to said two terminals.

6. A semiconductor device according to claim 1 in which the first p-n junction is additionally characterized as having a width of the order of 80 angstroms, and the second p-n junction is additionally characterized as having a width of the order of 150 angstroms.

7. A two-terminal three-zone semiconductor device comprising a first region of a semiconductor material of a first type of semiconductivity, an ohmic contact disposed upon and contiguous with one surface of said first region and forming one of said two terminals, the semiconductor material of the first region being doped to a high concentration whereby the material is degenerate, a second region of a semiconductor material of a second type of non-uniform semiconductivity disposed with one surface thereof adjacent and contiguous with one surface of said first region and forming a first p-n junction, a third region of a semiconductor material of said first type of semiconductivity disposed with one surface thereof adjacent and contiguous with the other surface of said second region and forming a second p-n junction, and an ohmic contact disposed upon and contiguous with the other surface of said third region and forming the second of said two terminals, the portion of the second region adjacent the first region being doped to a high degree of carrier concentration whereby the portion of the second region adjacent the first region is degenerate, the portion of the second region adjacent the third region being doped to a lesser degree of carrier concentration whereby the last-named portion is almost degenerate, the third region being doped to a high-carrier concentration whereby the material of the third region is degenerate, the first p-n junction controlling the current flow through said device while a potential of one polarity is applied between said two terminals and the second p-n junction controlling the current flow through said device while a potential of opposite polarity is applied between said two terminals.

8. A semiconductor device according to claim 7 wherein said first p-n junction displays negative resistance due to quantum mechanical tunneling over a portion of the I-V characteristic curve while a forward bias is applied thereto.

9. A semiconductor device according to claim 7 additionally characterized as having the first and third regions doped to a concentration of the order of $5\times10^{20}$ carriers per cubic centimeter, and wherein the portion of the second region adjacent the first region is doped to a concentration of $5\times10^{19}$ to $1\times10^{21}$ carriers per cubic centimeter and the portion of the second region adjacent the third region is doped to a concentration of the order of $5\times10^{18}$ carriers per cubic centimeter.

10. A two-terminal three-zone semiconductor device comprising a first region of a semiconductor material of a first type of semiconductivity, an ohmic contact disposed upon and contiguous with one surface of said first region and forming one of said two terminals, a second region of a semiconductor material of a second type of semiconductivity disposed upon and contiguous with one surface of said first region and forming a first p-n junction, a third region of a semiconductor material of said first type of semiconductivity disposed upon and contiguous with the other surface of said second region and forming a second p-n junction, and an ohmic contact disposed upon and contiguous with the other surface of said third region and forming the second of said two terminals, the second region having a gradient in the carrier concentration therein, the portion of the second region adjacent the first region being doped to a high degree of carrier concentration whereby said portion is degenerate, the portion of the second region adjacent the third region being doped to a lesser degree of carrier concentration whereby said last-named portion is almost degenerate, said first junction while a forward bias of first predetermined polarity and within predetermined amplitude limits is applied between said two terminals exhibiting negative resistance due to quantum mechanical tunneling in the first quadrant of the I-V characteristic curve, said second p-n junction while said potential of first predetermined polarity is applied to said two terminals being back-biased and characterized by a Zener breakdown condition, the first junction limiting the current flow through the second junction and through said device to the current characteristics of the first junction, said second junction while a potential of opposite polarity is applied to said two terminals exhibiting an exponential current-voltage characteristic curve similar to the curve of a normal forward-biased p-n junction, said first junction being reverse-biased while the potential of opposite polarity is applied to said two terminals, the current through the first junction and through said device being limited by the current flow through the second junction while said device has the potential of opposite polarity applied thereto.

11. A device according to claim 10 wherein the first region is additionally characterized as having the semiconductor material doped to a high concentration whereby the semiconductor material of the first region is degenerate, the semiconductor material of the third region being doped to a high degree of concentration whereby the semiconductor material of the third region is degenerate, the material of the portion of the second region adjacent the first region being doped to a high degree of concentration whereby the material of the second region in the portion thereof adjacent the first region is degenerate, the material of the portion of the second region adjacent the third region being doped to a lesser concentration whereby the material of the second region in the portion thereof adjacent the third region is almost degenerate.

12. A two-terminal three-zone semiconductor device comprising a first region of impure germanium, said first region having a first type of semiconductivity, said first region being doped to a high degree of carrier concentration whereby the material thereof is degenerate, a second region of impure germanium having one surface thereof disposed upon and contiguous with one surface of said first region, the second region of semiconductor material being of a second type of semiconductivity and having a gradient in the carrier concentration therein, a third region of semiconductor material of impure germanium having one surface thereof adjacent and contiguous with one surface of said second region, said third region being composed of semiconductor material of said first type of semiconductivity, said third region being doped to a high carrier concentration whereby the material of the third region is degenerate, the portion of the second region adjacent the first region being doped to a high degree of carrier concentration whereby the material of the last-named portion of the second region is degenerate, the portion of the second region adjacent the third region being doped to a lesser carrier concentration whereby the portion of the second region adjacent the third region is almost degenerate, and ohmic contacts disposed upon and contiguous with one surface of said first region and one surface of said third region.

13. A semiconductor device according to claim 12 wherein the device is additionally characterized as displaying negative resistance due to quantum mechanical tunneling over a portion of the I-V characteristic curve thereof while the device has a potential of a predetermined polarity applied between the ohmic contacts.

14. A semiconductor device according to claim 12 additionally characterized as providing a first p-n junction between the first and second regions and a second p-n junction between the second and third regions, the first junction controlling current flow through the device while the first junction is forward-biased by a potential of predetermined polarity applied between said terminals, the second p-n junction controlling current flow through the device while the second junction is forward-biased by a potential of opposite polarity applied between said terminals.

15. A semiconductor device according to claim 12 additionally characterized as having the first and third regions doped to carrier concentrations of the order of $5\times10^{20}$ per cubic centimeter, and having the portion of the second region adjacent the first region doped to a concentration of the order of $5\times10^{19}$ carriers per cubic centimeter, and the portion of the second region adjacent the third region being doped to a concentration of the order of $5\times10^{18}$ carriers per cubic centimeter.

16. A two-terminal three-zone semiconductor device comprising a first region of a material of a first type of semiconductivity doped to a carrier concentration of the order of $5\times10^{20}$ per cubic centimeter whereby the material of the first region is degenerate, an ohmic contact disposed upon and contiguous with one surface of said first region and forming one of said two terminals, a second region of a semiconductor material of a second type of semiconductivity disposed upon and contiguous with one surface of said first region and forming a narrow first p-n junction having a width of the order of 80 angstroms, the portion of the second region adjacent the first region being doped to a carrier concentration of the order of $5\times10^{19}$ to $1\times10^{21}$ per cubic centimeter whereby said portion of the second region is degenerate, the remaining portion of the second region being doped to a carrier concentration of the order of $5\times10^{18}$ per cubic centimeter whereby said remaining portion is almost degenerate, a third region of semiconductor material of the first type of semiconductivity disposed adjacent and contiguous with the second region and forming a second narrow p-n junction having a width of the order of 150 angstroms, the material of the third region being doped to a carrier concentration of the order of $5\times10^{20}$ per cubic centimeter whereby the material of the third region is degenerate, and an ohmic contact to the third region, the first p-n junction while biased in a forward direction by a potential of predetermined polarity applied between said two terminals exhibiting negative resistance due to quantum mechanical tunneling of electrons over a portion of the I-V characteristic curve in the first quadrant, said second p-n junction while said potential of predetermined polarity is applied to said two terminals being back-biased and characterized by a Zener breakdown condition, the first junction limiting the current flow through the second junction and through the device to the current characteristics of the first junction, said second junction while a potential of opposite polarity is applied to said two terminals exhibiting a current-voltage characteristic similar to that of a normal p-n junction while forward-biased, the current through the first junction and through the device being limited by the current flow through the second junction while said device has the potential of opposite polarity applied thereto.

References Cited in the file of this patent

UNITED STATES PATENTS 2,810,870 Hunter et al. ------------ Oct. 22, 1957